United States Patent
Sohn et al.

(10) Patent No.: US 9,892,821 B2
(45) Date of Patent: Feb. 13, 2018

(54) ELECTRICAL CONDUCTORS AND ELECTRONIC DEVICES INCLUDING THE SAME

(71) Applicant: SAMSUNG ELECTRONICS CO., LTD., Suwon-si, Gyeonggi-do (KR)

(72) Inventors: Hiesang Sohn, Seoul (KR); Weonho Shin, Seoul (KR); Yun Sung Woo, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/397,259

(22) Filed: Jan. 3, 2017

(65) Prior Publication Data
US 2017/0194074 A1     Jul. 6, 2017

(30) Foreign Application Priority Data

Jan. 4, 2016   (KR) .................. 10-2016-0000627

(51) Int. Cl.
*H01B 5/14*     (2006.01)
*H05B 33/28*    (2006.01)
(Continued)

(52) U.S. Cl.
CPC ............. *H01B 5/14* (2013.01); *C01B 32/186* (2017.08); *C03C 17/3644* (2013.01);
(Continued)

(58) Field of Classification Search
CPC .... H01B 5/14; H01B 1/02; H01B 1/04; H01L 31/1884
See application file for complete search history.

(56) References Cited

U.S. PATENT DOCUMENTS

| 8,748,749 B2* | 6/2014 | Srinivas | G06F 3/041 |
| | | | 174/250 |
| 2012/0080086 A1* | 4/2012 | Yoon | H01L 31/022466 |
| | | | 136/256 |

(Continued)

FOREIGN PATENT DOCUMENTS

| KR | 2011-0095751 A | 8/2011 |
| KR | 1274991 B1 | 6/2013 |

(Continued)

OTHER PUBLICATIONS

Extended European Search Report dated Apr. 13, 2017, issued for the corresponding European Patent Application No. 17150127.3-1504.

*Primary Examiner* — Timothy Thompson
*Assistant Examiner* — Amol Patel
(74) *Attorney, Agent, or Firm* — Cantor Colburn LLP

(57) ABSTRACT

An electrical conductor including a substrate, a first conductive layer including graphene, and a second conductive layer including a conductive metal nanowire, wherein the first conductive layer and the second conductive layer are disposed on the substrate, wherein the first conductive layer is disposed between the substrate and the second conductive layer or on the second conductive layer, wherein the first conductive layer has a first surface facing the second conductive layer and a second surface which is opposite to the first surface, and wherein, in the first surface and the second surface, the graphene is p-doped with a p-type dopant.

29 Claims, 7 Drawing Sheets

(51) Int. Cl.
*H01L 31/18* (2006.01)
*C03C 17/36* (2006.01)
*H01B 1/02* (2006.01)
*H01B 1/04* (2006.01)
*C01B 32/186* (2017.01)
*G06F 3/041* (2006.01)

(52) U.S. Cl.
CPC ...... *C03C 17/3649* (2013.01); *C03C 17/3671* (2013.01); *H01B 1/02* (2013.01); *H01B 1/04* (2013.01); *H01L 31/1884* (2013.01); *H05B 33/28* (2013.01); *G06F 3/0412* (2013.01)

(56) References Cited

U.S. PATENT DOCUMENTS

| | | | |
|---|---|---|---|
| 2013/0146846 A1* | 6/2013 | Adkisson | H01L 29/66045 257/27 |
| 2014/0014171 A1* | 1/2014 | Alam | G02F 1/13439 136/256 |
| 2015/0076450 A1 | 3/2015 | Weman et al. | |
| 2016/0293286 A1 | 10/2016 | Sohn et al. | |

FOREIGN PATENT DOCUMENTS

| | | |
|---|---|---|
| KR | 1351001 B1 | 1/2014 |
| KR | 1441062 B1 | 9/2014 |
| KR | 2014-0117894 A | 10/2014 |
| KR | 2016-0118007 A | 10/2016 |

* cited by examiner

P : p-type dopant

P : p-type dopant

P : p-type dopant

ELECTRICAL CONDUCTORS AND ELECTRONIC DEVICES INCLUDING THE SAME

CROSS-REFERENCE TO RELATED APPLICATIONS

This application claims priority to Korean Patent Application No. 10-2016-0000627 filed in the Korean Intellectual Property Office on Jan. 4, 2016, and all the benefits accruing therefrom under 35 U.S.C. § 119, the entire content of which is incorporated herein in its entirety by reference.

BACKGROUND

1. Field

Electrical conductors, methods of producing the same, and devices including the same are disclosed.

2. Description of the Related Art

An electronic device like a flat panel display such as LCD or LED, a touch screen panel, a solar cell, or a transparent transistor includes a transparent electrode. A material for a transparent electrode may be required to have, for example, high light transmittance of greater than or equal to about 80% and low specific resistance of less than or equal to about 100 microohm centimeters ($\mu\Omega$*cm) in a visible light region. The currently-used oxide material may include indium tin oxide (ITO), tin oxide ($SnO_2$), zinc oxide (ZnO), and the like. The ITO is widely used as a transparent electrode material which is a degenerate semielectrical conductor having a wide bandgap of 3.75 electron volts (eV) and may be easily sputtered to have a large area. However, since the ITO conventionally has limited conductivity and flexibility when applied to a flexible touch panel and a UD-level high resolution display, and also a high price due to its limited natural availability, many attempts to replace the ITO have been made.

Recently, a flexible electronic device as a next generation electronic device has been a subject of active research. Accordingly, development of a material securing flexibility as well as having transparency and relatively high conductivity other than the above transparent electrode material is required. Research efforts on using graphene, which is one of flexible conductive materials, for an electrical conductor (e.g., transparent electrode for a flexible electronic device, etc.) have been undertaken. There is currently a need to develop a graphene-based material having improved electric/optical properties.

SUMMARY

An embodiment provides an electrical conductor including graphene.

Another embodiment provides a method of producing the electrical conductor.

Yet another embodiment provides a bendable or foldable electronic device including the electrical conductor.

In an embodiment, an electrical conductor includes
 a substrate;
 a first conductive layer including graphene; and
 a second conductive layer including a conductive metal nanowire,
 wherein the first conductive layer and the second conductive layer are disposed on the substrate, wherein the first conductive layer is disposed between the substrate and the second conductive layer or on the second conductive layer, wherein the first conductive layer has a first surface facing the second conductive layer and a second surface which is opposite to the first surface, and
 wherein, in the first surface and the second surface, the graphene is p-doped with a p-type dopant.

The substrate may include glass, a semielectrical conductor, a polymer, or a combination thereof.

The polymer may include polyester, polycarbonate, polyimide, or a combination thereof.

The graphene may be monolayered graphene.

The graphene may be multi-layered graphene having 10 or less monolayers.

The first conductive layer may include transferred graphene.

The first conductive layer may include a plurality of graphene nanosheets.

The conductive metal nanowire may include silver, copper, gold, aluminum, cobalt, palladium, or a combination thereof.

The conductive metal nanowire may have an average diameter of less than or equal to about 50 nanometers and an average length of greater than or equal to about 1 micrometer.

The p-type dopant may have a work function of greater than or equal to about 4.52 electron volts.

The p-type dopant may include a metal, a metal oxide, a metal salt, an inorganic acid, an organic compound, or a combination thereof.

The p-type dopant may include gold, silver, palladium, titanium, gallium, aluminum, tungsten, ruthenium, copper, or a combination thereof.

The p-type dopant may include a metal nanoparticle, a metal oxide, a metal oxide nano particle, a metal salt, a metal halide, a metal trifluoromethanesulfonate, a metal trifluoromethanesulfonylimide, or a combination thereof.

The p-type dopant may include a gold nanoparticle, a silver nanoparticle, a palladium nanoparticle, a titanium nanoparticle, a gallium nanoparticle, $AgCl_3$, $AuCl_3$, $FeCl_3$, $GaCl_3$, $HAuCl_4$, AgOTf, $AgNO_3$, aluminum trifluoromethanesulfonate, silver bistrifluoromethanesulfonylimide, or a combination thereof.

The p-type dopant may include nitric acid, sulfuric acid, hydrochloric acid, phosphoric acid, $NO_2BF_4$, $NOBF_4$, $NO_2SbF_6$, $H_3CCOOH$, dichlorodicyanoquinone, oxone, dimyristoyl phosphatidylinositol, benzimidazole, bistrifluoromethanesulfonylamide, bistrifluoromethanesulfonylimide, N,N-di(1-naphthyl)-N,N-diphenylbenzidine, chloroform, $NO_2$, a C6 to C40 aromatic compound, 2,3,5,6-tetrafluoro-7,7,8,8-tetracyanoquinodimethane, 7,7,8,8-tetracyanoquinodimethane, tetracyanoethylene, tetrakis(dimethylamino)ethylene, anthracene, melamine, water, ozone, 9,10-dibromoanthracene, tetrasodium 1,3,6,8-pyrenetetrasulfonic acid, a perfluoro polymer, polymethylmethacrylate, polyvinylidene difluoride, ammonia, triazine, 1,5-naphthalenediamine, 9,10-dimethylanthracene, nitromethane, or a combination thereof.

The p-type dopant may be nitric acid, gold trichloride, benzimidazole, or a combination thereof.

In the first surface and the second surface the graphene may be doped with the same p-type dopant.

In the first surface and the second surface the graphene may be doped with an inorganic acid.

In the first surface and the second surface, the graphene may be doped with p-type dopants which are different from each other.

In the first surface, the graphene may be doped with an inorganic acid, and in the second surface, the graphene may be doped with a metal halide.

In the second surface, the graphene may be doped with an inorganic acid and in the first surface, the graphene may be doped with a metal halide.

The electrical conductor may be a transparent electrode or an electrode for a touch screen panel.

In another embodiment, a method of producing the aforementioned electrical conductor includes:

obtaining a first conductive layer having a release film and graphene disposed directly on the release film;

p-type doping a surface of the graphene of the first conductive layer with a first p-type dopant;

disposing the first conductive layer on a substrate while the p-type doped surface of the graphene facing the substrate;

removing the release film from the first conductive layer to expose a undoped surface of the graphene;

p-type doping the undoped surface of the graphene with a second p-type dopant; and forming a second conductive layer including a conductive metal nanowire on the surface of the p-type doped graphene.

The p-type doping with the first p-type dopant may include bringing a solution including the first p-type dopant into a contact with the graphene layer of the first conductive layer.

The p-type doping with the second p-type dopant may include bringing a vaporized second p-type dopant into a contact with the surface of the undoped graphene.

The first p-type dopant and the second p-type dopant may be a metal nanoparticle, a metal halide, a metal salt, an inorganic acid, an organic compound, a metal trifluoromethanesulfonate, a metal trifluoromethanesulfonylimide, or a combination thereof.

The first p-type dopant and the second p-type dopant may be the same materials.

The first p-type dopant and the second p-type dopant may be materials which are different from each other.

In another embodiment, a bendable or foldable electronic device may include the electrical conductor.

The electronic device may be a flat panel display, a touch screen panel, a solar cell, an e-window, an electrochromic mirror, a heat mirror, a transparent transistor, or a flexible display.

In another embodiment, an electrical conductor includes:

a substrate; and a first conductive layer including graphene on the substrate, wherein the graphene has a first surface facing the substrate and a second surface opposed to the first surface, and the first surface and the second surface are respectively p-doped with a p-type dopant.

In the electrical conductors of some embodiments, the dual doped graphene may be utilized in order to improve electrical properties together with optical properties.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
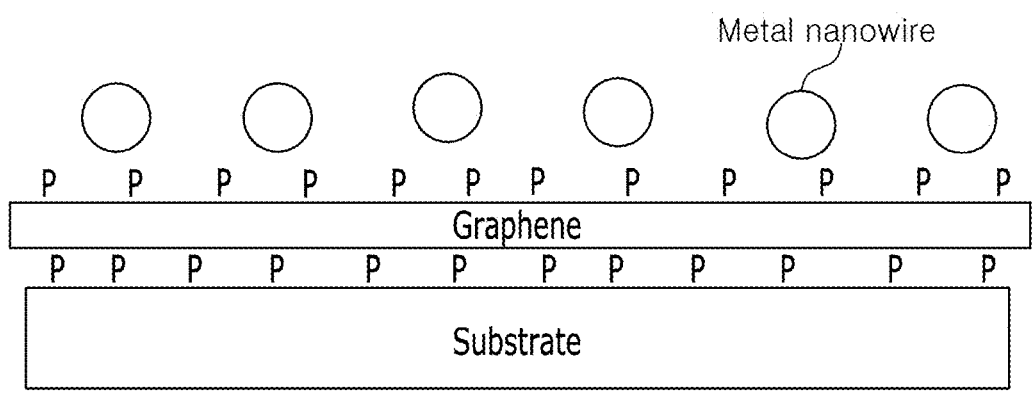
FIG. 1 is a schematic view showing a cross-section of an electrical conductor according to an embodiment.

Advantages and characteristics of this disclosure, and a method for achieving the same, will become evident referring to the following exemplary embodiments together with the drawings attached hereto. However, the embodiments should not be construed as being limited to the embodiments set forth herein.

If not defined otherwise, all terms (including technical and scientific terms) in the specification may be defined as commonly understood by one skilled in the art to which this general inventive concept belongs. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Further, the singular includes the plural unless mentioned otherwise.

In the drawings, the thickness of layers, regions, etc., are exaggerated for clarity. Like reference numerals designate like elements throughout the specification.

It will be understood that when a first element is referred to as being "on" a second element, it may be directly on the other element or intervening elements may also be present. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." As used herein, the term "and/or" includes any and all combinations of one or more of the associated listed items. Expressions such as "at least one of," when preceding a list of elements, modify the entire list of elements and do not modify the individual elements of the list.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

In the specification, the sheet resistance refers to a value defined by the 4-point probe measurement for the specimen having a predetermined size (e.g., a width of 8 centimeters (cm) and a length of 8 cm).

As used herein, the "transmittance" may be a value wherein the light absorbance of a substrate is considered. For example, when a PET substrate is used, light transmittance of the PET substrate itself is about 92.5%.

As used herein, the (meth)acrylate refers to acrylate or methacrylate.

As used herein, the term "metal" may include a metal and a semi-metal such as silicon (Si).

In an embodiment, an electrical conductor includes:
a substrate;
a first conductive layer including graphene; and
a second conductive layer including a conductive metal nanowire.

Figure 2:
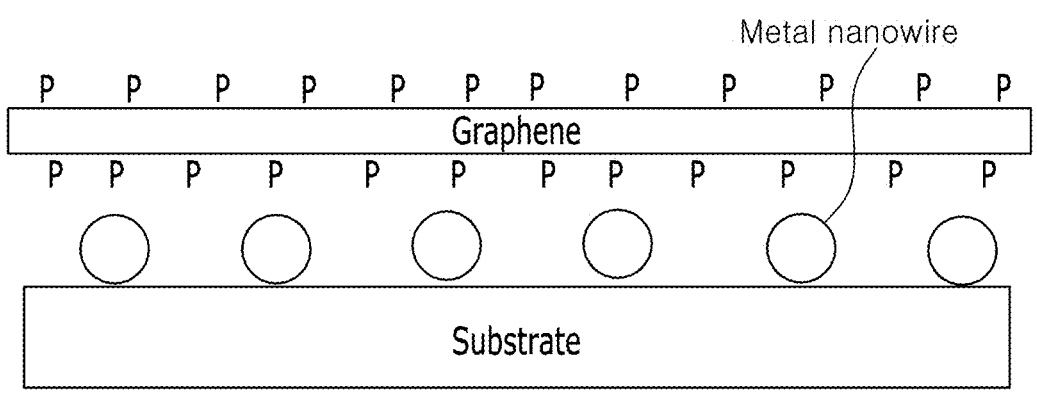
FIG. 2 is a schematic view showing a cross-section of an electrical conductor according to another embodiment.

The first conductive layer and the second conductive layer are disposed on a substrate. For example, the first conductive layer is disposed on the substrate and the second conductive layer is disposed on the first conductive layer (see FIG. 1). Alternately, the second conductive layer is disposed on the substrate and the first conductive layer is disposed on the second conductive layer (see FIG. 2).

The substrate may be a transparent substrate. The substrate may be flexible. A material of the substrate is not particularly limited. The substrate may include a glass substrate, a semielectrical conductor substrate, a polymer substrate, or a combination thereof. The substrate may include a substrate having an insulation layer and/or a conductive layer laminated thereon. In non-limiting examples, the substrate may include an inorganic material such as oxide glass and glass, polyester such as polyethylene terephthalate, polybutylene terephthalate, and polyethylene naphthalate, polycarbonate, an acryl-based resin, a cellulose, or a derivative thereof, a polymer such as polyimide, or an organic/inorganic hybrid material, or a combination thereof. The thickness of the substrate is not particularly limited and may be appropriately selected depending on the types of the resulting product. For example, the thickness of the substrate may be greater than or equal to about 10 micrometers (μm), for example, greater than or equal to about 50 μm, or greater than or equal to about 75 μm but is not limited thereto. In some embodiments, the polymer substrate may have a thickness of about 50 μm to about 100 μm, or about 75 μm to about 100 μm, but is not limited thereto. The thickness of the substrate may be less than or equal to about 2 millimeters (mm), for example, less than or equal to about 500 μm, or less than or equal to about 200 μm but is not limited thereto.

The first conductive layer included in the electrical conductor includes graphene. The graphene may be a monolayer graphene. Alternatively, the graphene may be a multi-layered graphene including less than or equal to about 10, for example, less than or equal to about 6, less than or equal to about 5, or less than or equal to about 4 of monolayers.

The first conductive layer may include a plurality of graphene nanosheets. For example, the first conductive layer may be a graphene layer obtained by coating a composition including nanosheets of graphene or its derivative such as graphene oxide to provide a thin film; and reducing the same. The graphene layer may include the reduced graphene oxide (RGO) nanosheets.

The first conductive layer may include a transferred graphene. For example, the first conductive layer including the graphene may be obtained by growing a graphene layer on a metal substrate in any known manner; attaching a release film thereon; etching the metal to provide a release film-graphene stacked structure; and removing the release film in the appropriate step.

The metal substrate may include at least one metal or an alloy selected from Cu, Ni, Co, Fe, Pt, Au, Ru, Al, Cr, Mg, Mn, Mo, Rh, Si, Ta, Ti, W, U, V, Zr, brass, bronze, white brass, stainless steel, and Ge. The graphene layer on the metal substrate is formed by thermal decomposition deposition, chemical vapor deposition (CVD) processes on at least one side of the metal substrate. For example, a rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD) or plasma-enhanced chemical vapor deposition (PECVD), and the like may be used without limitation. The appropriate conditions for each process are also known.

When the graphene is deposited on the metal substrate, it may be performed at a temperature from 300° C. to a temperature of below the melting point of metal substrate and under a pressure from $10^{-7}$ millitorr (mTorr) to the atmospheric pressure. The release film attached to the graphene may include at least one selected from a polymer such as thermal release tape, polymers such as polyethylene terephthalate, polyimide, polyethylene naphthalate, polycarbonate, and the like, an inorganic material such as glass or a silicon wafer, a porous organic-inorganic membrane, a metal organic frame, an ion exchange film, and a membrane electrode. The laminate structure may be formed via a roll-to-roll process. For example, it may be formed by laminating a release film on the metal substrate-graphene layer and passing the same through at least one roller or a roller member including a plurality of rollers facing each other, if desired.

During the formation of the laminate structure via the roll-to-roll process, a polymer binder film may be provided between the metal substrate-graphene layer and the release film in order to laminate the release film on the metal substrate-graphene layer. In some embodiments, the release film may be disposed on the metal substrate-graphene layer and then heat-treated to laminate the same on the metal substrate-graphene layer. The polymer binder film may include at least one selected from polystyrene, polyethylene, polyalkylene glycol, poly(methylmethacrylate), polyvinylpyrrolidone, Nafion™, sodium poly(acrylate), poly(diallyldimethyl ammonium chloride), and polyethyleneimine. The formation of the polymer binder film may be made by utilizing the aforementioned roller.

The heat treatment may be performed at a temperature of about 60° C. to about 200° C., for example, at a temperature of about 120° C. to about 160° C. While not wishing to be bound by theory, it is understood that within the above temperature ranges, the bond between the graphene and the release film may be enhanced by the heat treatment. The laminating may be performed at a room temperature and under the atmospheric pressure. The graphene-release film structure may be obtained by subjecting the laminate structure to the etching process and removing the metal substrate.

The graphene present on the opposite surfaces of the first conductive layer is doped with p-type dopant. In the other words, the first conductive layer has a first surface facing the second conductive layer and a second surface opposite to the first surface, and the graphene is p-doped with p-type dopant on the first surface and second surface.

Graphene has a structure including a single sheet of carbon atoms arranged in a honeycomb lattice, and may show a high thermal conductivity, a high charge carrier mobility and excellent mechanical properties (e.g., high elasticity and strength, flexibility). Graphene is known as a highly flexible transparent conductive film material so that it may be substituted for indium tin oxide (ITO) having inferior mechanical characteristics. However, graphene has such a high light absorption coefficient that it may not provide a desirable sheet resistance at a transmittance required for a transparent electrode material. Nanowire (1D material) and a hybrid structure may be considered to address these drawbacks. However, improving the conductivity of the structures may still be desired. The electrical conductor according to an embodiment may show improved electric properties at a relatively high transmittance by doping the opposite surfaces of the graphene containing first conductive layer with the p-type dopant.

The p-type dopant may have a work function of greater than or equal to about 4.52 electron volts (eV), for example, greater than or equal to about 4.6 eV. For example, the p-type dopant may be a metal (metal element or nanoparticle) or a compound (oxide, salt, etc.) including the same having a work function of greater than or equal to about 4.52 eV. For example, the p-type dopant may include gold (Au), silver (Ag), palladium (Pd), titanium (Ti), gallium (Ga), aluminum (Al), tungsten (W), ruthenium (Ru), copper (Cu), or a combination thereof. The p-type dopant may include a metal nanoparticle, a metal oxide, a metal oxide nano particle, a metal salt, a metal halide, a metal trifluoromethanesulfonate, a metal trifluoromethanesulfonylimide, or a combination thereof. Examples of the p-type dopant may be a gold nanoparticle, a silver nanoparticle, a palladium nanoparticle, a titanium nanoparticle, a gallium nanoparticle, $AgCl_3$, $AuCl_3$, $FeCl_3$, $GaCl_3$, $HAuCl_4$, silver trifluoromethanesulfonate (AgOTf), $AgNO_3$, aluminum trifluoromethanesulfonate, and silver bistrifluoromethanesulfonylimide, but are not limited thereto.

The p-type dopant may include inorganic acid, an organic compound, or a combination thereof. The p-type dopant may include nitric acid, sulfuric acid, hydrochloric acid, phosphoric acid, $NO_2BF_4$, $NOBF_4$, $NO_2SbF_6$, $H_3CCOOH$, dichlorodicyanoquinone, oxone, dimyristoyl phosphatidylinositol, benzimidazole, bistrifluoromethanesulfonylamide (TFSA), bistrifluoromethanesulfonylimide, N,N-di(1-naphthyl)-N,N-diphenylbenzidine (beta-NDP), chloroform, $NO_2$, a C6 to C40 aromatic compound, 2,3,5,6-tetrafluoro-7,7,8,8-tetracyanoquinodimethane (F4-TCNQ), 7,7,8,8-tetracyanoquinodimethane (TCNQ), tetracyanoethylene (TONE), tetrakis(dimethylamino)ethylene (TDAE), anthracene (ANTR), melamine, water ($H_2O$), ozone, 9,10-dibromoanthracene, tetrasodium 1,3,6,8-pyrenetetrasulfonic acid, a perfluoro polymer, polymethylmethacrylate, polyvinylidene difluoride, ammonia, triazine, 1,5-naphthalenediamine, 9,10-dimethylanthracene, nitromethane, benzimidazole, or a combination thereof.

Graphene present on the first surface (i.e., surface facing the second conductive layer, which will be described in later) and the second surface (i.e., surface opposite to the first surface) of the first conductive layer may be doped with the p-type dopant according to a wet doping or a dry doping. The doping may use a self-assembled layer of the dopant. A manner of the doping may be selected in light of a type of the dopant, a type of the substrate, a type of the graphene layer (e.g., graphene formed by nanosheets or transferred graphene), or the like.

In some embodiments, a wet doping may be carried out by a spin- or a dip coating of a dopant-containing solution, it may be a charge-transport doping (or surface transport doping) wherein a doping is carried out via electron (or hole) exchange between dopant and graphene. In the surface charge doping, an electron or hole is localized on the surface to construct electrostatic potential. Thus the charges are confined in a vertical direction but may be freely transported in a direction parallel to the surface.

The wet doping may include contacting the dopant containing solution with a surface of the graphene. For example, the wet doping may include treating with an inorganic acid, a metal chloride, an organic substance, or a combination thereof. The treating with the inorganic acid may include contacting (dipping or spin coating) an inorganic acid solution (e.g., a nitric acid aqueous solution) with the surface of the graphene. The treating with the metal chloride may include contacting graphene with a solution of a chloride of a metal (e.g., Au, Ir, Mo, Os, Pd, etc.) having a higher work function than the work function of graphene. The metal ion in the metal chloride has the positive charge, which may bring the electron from the graphene in order to become a zero charge. The treating with the organic substance may include contacting a surface of the graphene with a solution including an organic compound (e.g., bis(trifluoromethane sulfonyl)amide (TFSA)).

In some embodiments, a dry doping may include evaporation wherein a thin film of the aforementioned dopant may be deposited on the surface of the graphene and thereby a surface charge transport may occur.

At the first surface and the second surface, the graphene may be doped (e.g., symmetrically) with the same p-type dopant. In some embodiments, in the first surface and the second surface of the first conductive layer, the graphene may be doped by the inorganic acid. In the first surface and the second surface, the graphene may be doped (e.g., asymmetrically) by using different p-type dopants from each other. In some embodiments, in the first surface, the graphene may be doped with the inorganic acid, and in the second surface, the graphene may be doped with the metal halide. In other embodiments, the graphene may be doped by the inorganic acid in the second surface, and the graphene may be doped by the metal halide in the first surface.

During the doping process, the concentration of the p type dopant in the solution may be greater than or equal to about 0.01 M, for example, greater than or equal to about 0.05 M, greater than or equal to about 0.1 M, greater than or equal to about 0.2M, greater than or equal to about 0.3M, greater than or equal to about 0.4M, or greater than or equal to about 0.5 M. The concentration of the dopant in the solution may be less than about 10 M, for example, less than or equal to about 9 M, less than or equal to about 8 M, less than or equal to about 7 M, less than or equal to about 6 M, less than or equal to about 5 M, less than or equal to about 4 M, less than or equal to about 3 M, or less than or equal to about 2 M.

The degree of the doping may be determined by appropriate analysis tools such as an X-ray or Ultraviolet Photoelectron Spectroscopy analysis and a Raman spectroscopy analysis. For example, the peak for the two dimensional structure (2D peak), which may be present greater than or equal to about 2400 $cm^{-1}$, greater than or equal to about 2500 $cm^{-1}$, or greater than or equal to about 2600 $cm^{-1}$, may move to a longer Raman shift by about 10 $cm^{-1}$ or greater, about 11 $cm^{-1}$ or greater, about 12 $cm^{-1}$ or greater, about 13 $cm^{-1}$ or greater, about 14 $cm^{-1}$ or greater, about 15 $cm^{-1}$ or greater, about 16 $cm^{-1}$ or greater, about 17 $cm^{-1}$ or greater, about 18 $cm^{-1}$ or greater, about 19 $cm^{-1}$ or greater, about 20 $cm^{-1}$ or greater, about 21 $cm^{-1}$ or greater, or about 22 $cm^{-1}$ or greater.

The energy level of work function for the doped graphene may be greater than or equal to about 4.6 eV, for example, greater than or equal to about 4.61 eV, greater than or equal to about 4.68 eV, greater than or equal to about 4.8 eV, greater than or equal to about 4.85 eV, or greater than or equal to about 4.9 eV.

Graphene having the first surface (or second surface) exposed by the metal etching is doped by a p-type dopant. Subsequently, a release film is removed in an appropriate step to expose a second surface (or first surface) of graphene, and graphene is doped by p-type dopant. The removing of the release film may be appropriately performed depending on the types of release film, but is not particularly limited. For example, the release film may be removed by using a solvent such as ethanol or taping (e.g., an adhesive tape having appropriate adherence is applied and then peeled off), but is not limited thereto.

The electrical conductor according to an embodiment may be a 1D (one dimensional)—2D (two dimensional) hybrid structure wherein a second conductive layer including a conductive metal nanowire is disposed on or below the first conductive layer including the dual p-doped graphene. Therefore, in the electrical conductor, two conductive layers are connected in parallel to each other. In the electrical conductor of the embodiments, the first conductive layer including the dual p-doped graphene has a lower sheet resistance even at a relatively high level of light transmittance and thereby the parallel resistance may decrease. Without being bound by any particular theory, it is believed that even when the concentration of the conductive metal nanowire is not high, the unconnected portions between the conductive metal nanowires may be connected by the dual p-type doped graphene having a high conductivity (i.e., a low sheet resistance), and as a result, the parallel resistance may decrease and thereby the electrical conductor may show an improved conductivity.

The conductive metal may include silver (Ag), copper (Cu), gold (Au), aluminum (Al), cobalt (Co), palladium (Pd), or a combination thereof (e.g., an alloy thereof, or nanometal wire having at least two segments). For example, the conductive metal nanowire may include a silver nanowire.

The conductive metal nanowire may have an average diameter of less than or equal to about 50 nm, for example, less than or equal to about 40 nm, or less than or equal to about 30 nm. The length of the conductive metal nanowire is not particularly limited, but may be appropriately selected depending on a diameter thereof. For example, the conductive metal nanowire may have a length of greater than or equal to about 1 μm, greater than or equal to about 2 μm, greater than or equal to about 3 μm, greater than or equal to about 4 μm, greater than or equal to about 5 μm, but is not limited thereto. According to another embodiment, the conductive metal nanowire may have a length of greater than or equal to about 10 μm, for example, greater than or equal to about 11 μm, greater than or equal to about 12 μm, greater than or equal to about 13 μm, greater than or equal to about 14 μm, or greater than or equal to about 15 μm. The conductive metal nanowire may be fabricated in any known method or may be commercially available. The nanowire may include a polymer coating such as polyvinylpyrrolidone on the surface.

Formation of the second conductive layer including the conductive metal nanowire may be carried out by any known method of forming a layer, and is not particularly limited. In non-limiting examples, the second layer may be formed by applying an appropriate coating composition including a conductive metal nanowire on the substrate or the first conducting layer, and removing a solvent. The coating composition may further include an appropriate solvent (e.g., water, organic solvent miscible or non-miscible with water, etc.) and a dispersing agent (e.g., hydroxypropylmethyl cellulose (HPMC), C2 to C20 organic acid).

For example, the ink composition including the electrically conductive metal nanowire may be commercially available or may be prepared in any known manner. For example, the ink composition may have a composition set forth in Table 1, but is not limited thereto.

TABLE 1

| | Materials | Amount (wt %) |
|---|---|---|
| Conductive metal | Conductive metal (e.g. Ag) nanowire an aqueous solution (concentration: 0.001-10.0 wt %) | 5-40% |
| Solvent | Water | 20-70% |
| | Alcohol (ethanol) | 10-50% |
| Dispersing agent or binder | Hydroxypropyl methyl cellulose aqueous solution (conc.: 0.05-5 wt %) | 1-10% |

The composition is coated on a substrate (or optionally, preliminarily formed first conductive layer) and, optionally, dried and/or heat-treated to provide a conductive layer. Coating of the composition may be performed by various methods, and for example, the composition may be applied via a bar coating, a blade coating, a slot die coating, a spray coating, a spin coating, a gravure coating, an ink jet printing, or a combination thereof.

The second conductive layer may include an organic binder to bind the conductive metal nanowires. The binder may control a viscosity of a composition for forming a conductive layer or increase a binding force of the nanowires to a substrate. Non-limiting examples of the binder may include methyl cellulose, ethyl cellulose, hydroxypropyl methyl cellulose (HPMC), hydroxypropyl cellulose (HPC), a xanthan gum, polyvinyl alcohol (PVA), polyvinyl pyrrolidone (PVP), carboxymethyl cellulose, hydroxyethyl cellulose, or a combination thereof. An amount of the binder may be appropriately selected and is not particularly limited. In non-limiting examples, an amount of the binder may be about 1 parts by weight to about 100 parts by weight based on 100 parts by weight of the nanowire.

A thickness of the second layer may be appropriately selected considering the desirable conductivity and light transmittance of transparent electrode, and the like, but is not particularly limited.

As described above, the electrical conductor may further include an overcoating layer (OCL) including a thermosetting resin, an ultraviolet (UV) curable resin, or a combination thereof on the first conductive layer or the second conductive layer. Specific examples of the thermosetting resin and the ultraviolet (UV) curable resin for OCL are known. In an embodiment, the thermosetting resin and the ultraviolet (UV) curable resin for an overcoating layer (OCL) may be urethane(meth)acrylate, perfluoropolymer having a (meth)acrylate group, poly(meth)acrylate having a (meth)acrylate group, epoxy(meth)acrylate, or a combination thereof. The overcoating layer may further include an inorganic oxide particulate (e.g., silica particulate). The method of forming the OCL on the first/second conductive layer using the above-mentioned materials is also known, and is not particularly limited.

The electrical conductor according to an embodiment may have improved conductivity at relatively high light transmittance. For example, the electrical conductor may have a low sheet resistance (e.g., of less than or equal to about 500 ohms per square ($\Omega$/sq.), for example less than or equal to about 400 $\Omega$/sq., or less than or equal to about 350 $\Omega$/sq.) even at relatively high light transmittance (e.g., greater than or equal to about 80%, for example, greater than or equal to about 85%, greater than or equal to about 86%, greater than or equal to about 87%, or greater than or equal to about 88%). Accordingly, the electrical conductor may be used in a transparent electrode, a touch screen panel electrode, a flexible display device, or the like.

In another embodiment, a method of producing the aforementioned electrical conductor includes:
obtaining a first conductive layer having a release film and graphene disposed directly on the release film;
p-type doping a surface of the graphene of the first conductive layer with a first p-type dopant;
disposing the first conductive layer on a substrate with the p-type doped surface of the graphene facing the substrate;
removing the release film from the first conductive layer to expose a surface of undoped graphene;
p-type doping the surface of the undoped graphene with a second p-type dopant; and
forming a second conductive layer including a conductive metal nanowire on the surface of the p-type doped graphene.

Details of the substrate, the first conductive layer including the graphene, the release layer, and the second conductive layer including the conductive metal nanowire are set forth above.

The p-type doping with the first p-type dopant may include bringing a solution including the first p-type dopant into a contact with the graphene layer of the first conductive layer. The p-type doping with the second p-type dopant may include bringing a vaporized second p-type dopant into a contact with the surface of the undoped graphene.

Specific examples of the first p-type dopant and the second p-type dopant are the same as described above. The first p-type dopant and the second p-type dopant may be the same materials. The first p-type dopant and the second p-type dopant may be materials which are different from each other. Details of the doping method are the same as described above.

In another embodiment, an electronic device includes the electrical conductor.

The electronic device may be a flat panel display, a touch screen panel, a solar cell, an e-window, an electrochromic mirror, a heat mirror, a transparent transistor, or a flexible display.

Figure 3:
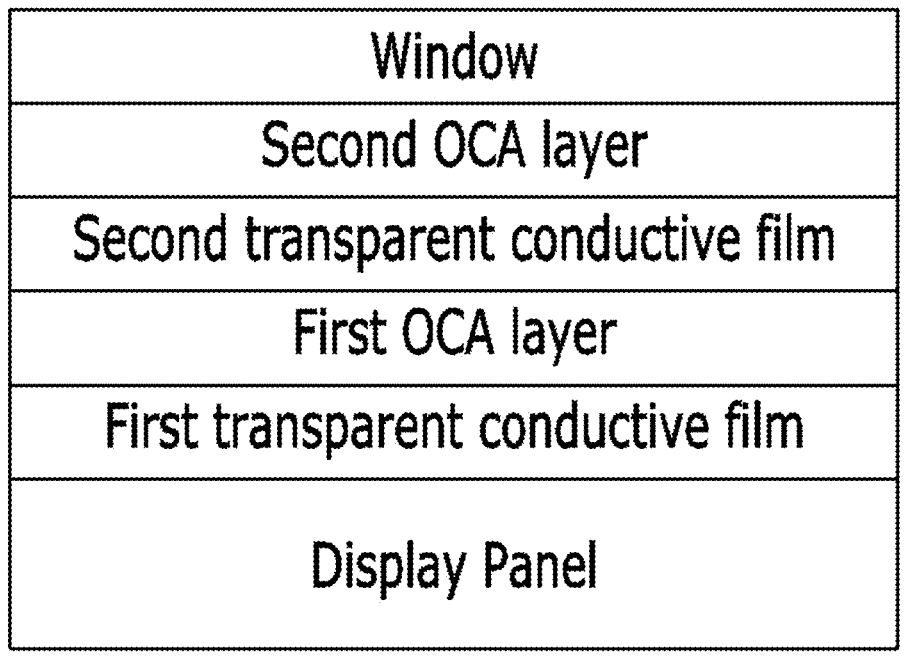
FIG. 3 is a schematic view showing a cross-section of an electronic device (touch screen panel) according to an embodiment.
Figure 4:
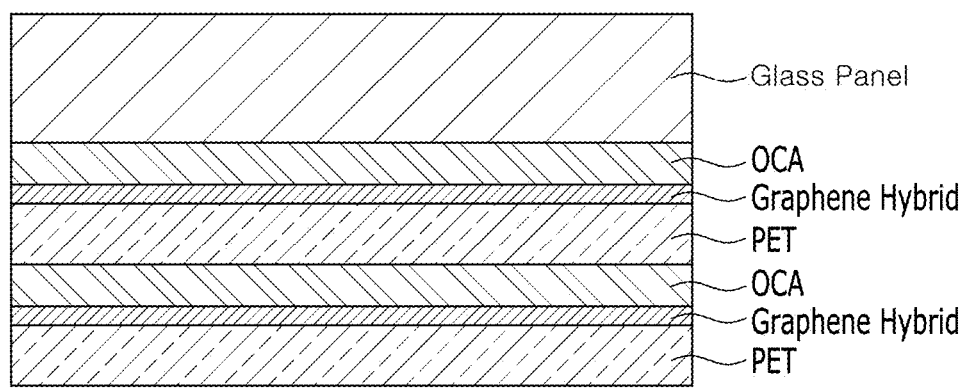
FIG. 4 is a schematic view showing a cross-section of an electronic device (touch screen panel) according to another embodiment.

In an example embodiment, the electronic device may be a touch screen panel (TSP). The detailed structure of the touch screen panel is well known. The schematic structure of the touch screen panel is shown in FIGS. 3 and 4. Referring to FIG. 3, the touch screen panel may include a first transparent conductive film, a first transparent adhesive film (e.g., an optically clear adhesive (OCA)) film, a second transparent conductive film, a second transparent adhesive film, and a window for a display device, on a panel for a display device (e.g., an LCD panel). The first transparent conductive film and/or the second transparent conductive film may be the electrical conductor. Referring to FIG. 4, the touch screen panel may have a structure of the substrate-graphene-containing hybrid structure-OCA-substrate-graphene-containing hybrid structure-OCA-glass panel.

In addition, an example of applying the electrical conductor to a touch screen panel (e.g., a transparent electrode of TSP) is illustrated, but the electrical conductor may be used as an electrode for other electronic devices including a transparent electrode without a particular limit. For example, the electrical conductor may be applied as a pixel electrode and/or a common electrode for a liquid crystal display (LCD), an anode and/or a cathode for an organic light emitting diode device, or a display electrode for a plasma display device.

Figure 14:
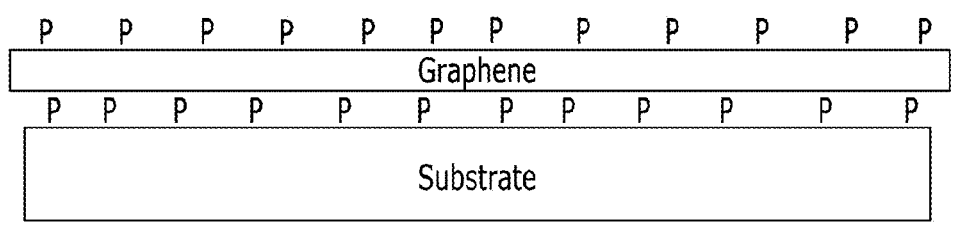
FIG. 14 is a schematic view showing a cross-section of an electrical conductor according to another embodiment.

Furthermore, according to another embodiment, the electrical conductor includes a substrate; a first conductive layer including graphene and disposed on the substrate, wherein the graphene has a first surface facing the substrate and a second surface opposite to the first surface; and each of the first surface and the second surface is p-doped with p-type dopant (reference: FIG. 14). The substrate, the graphene, and the dopant are the same as described above.

Hereinafter, the embodiments are illustrated in more detail with reference to examples. These examples, however, are not in any sense to be interpreted as limiting the scope of this disclosure but serve to illustrate the present inventive concept only.

EXAMPLES

Measurement:

[1] Measurement of sheet resistance: Sheet resistance is measured as follows.

Measurer: Mitsubishi Ioresta-GP (MCP-T610), ESP-type probes (MCP-TP08P)

Sample size: width 8 cm×length 8 cm (cm=centimeters)

Measurement: average after repeating the measurement at least 9 times

[2] Light transmittance measurement: Light transmittance is measured as follows.

Measurer: NIPPON DENSHOKU INDUSTRIES (NDH-7000 SP)

Sample size: width 8 cm×length 8 cm

Sample Measurement: average after repeating the measurement at least 9 times

[3] Haze Measurement: Haze is measured as follows.

Measurer: NIPPON DENSHOKU INDUSTRIES (NDH-7000 SP)

Sample size: width 8 cm×length 8 cm

Sample Measurement: average after repeating the measurement at least 9 times

[4] Scanning Electron Microscope (SEM): Scanning electron microscopic analysis is performed using FE-SEM (Field Emission Scanning Electron Microscope) Hitachi (SU-8030)

[5] X-ray Photoelectron Spectroscopy: XPS Analysis is performed using an X-ray photoelectron spectrometer (manufacturer: ULVAC-PHI, product name: Quantera II).

[6] Raman Spectrum Analysis: Raman spectrum analysis is performed using a Raman spectrometer (product name: micro-Raman_K inVia, manufacturer: Renishaw).

[7] Ultraviolet (UV) Photoelectron Spectroscopy: UPS analysis is performed using an ultraviolet (UV) photoelectron spectrometer (manufactured by ULVAC-PHI, model name: Quantera II).

Example 1: Electrical Conductor Having Dual p-Type Doped Graphene Layer

Figure 5:
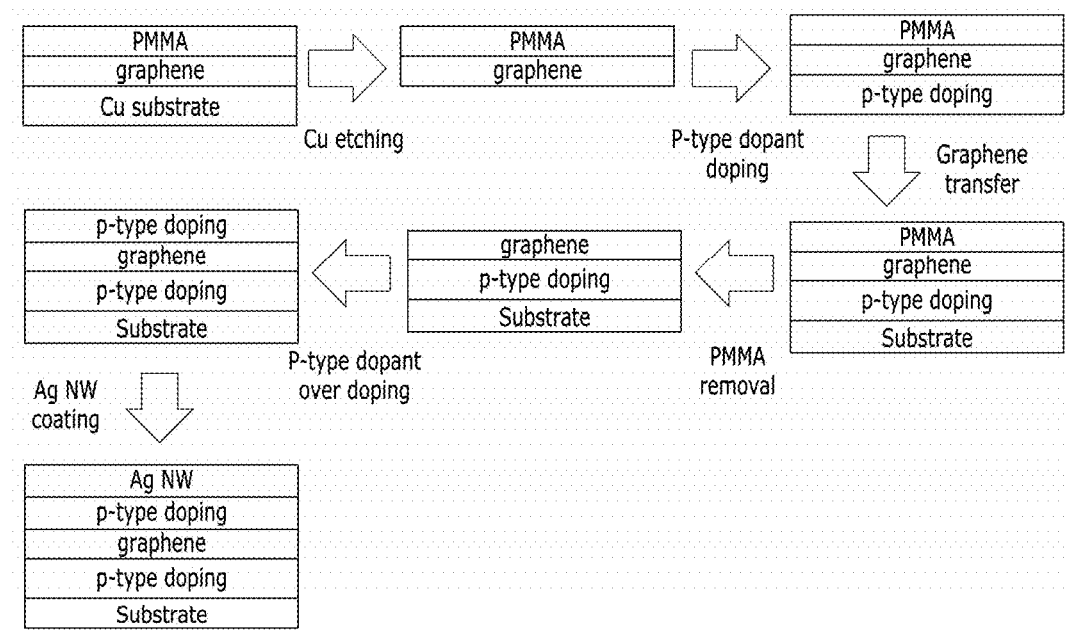
FIG. 5 is a flow chart illustrating a method of manufacturing an electrical conductor in Example 1.

According to the method shown in FIG. 5, the electrical conductor is fabricated as follows:

[1] A graphene layer is deposited on one surface of a copper substrate by a low pressure chemical vapor deposition (CVD), and a polymethylmetacrylate (PMMA) film is coated on the graphene layer and cured. The obtained resulting product is copper-etched using $FeCl_3$ or ammonium persulfate as a Cu etchant to provide a graphene-release film structure.

[2] Under-doping

A nitric acid aqueous solution having a concentration of 1 molar (M) is prepared, and the graphene-release film structure is immersed in the aqueous solution for 5 minutes and then taken out. Subsequently, the graphene-release film structure is disposed on the substrate with the graphene surface being contacted to the glass substrate and dried. Then the release film is removed therefrom to provide a substrate-graphene stacked structure, and the exposed graphene surface is cleaned by acetone to remove the remained nitric acid and to provide a substrate-graphene structure that the graphene surface (facing the substrate) is p-doped by nitric acid (hereinafter, electrical conductor having a under p-doped graphene layer).

[3] Over-doping

A nitric acid aqueous solution having a concentration of 70% is placed in a sealable first container having a volume of 50 milliliters (mL). A second container having a volume smaller than the first container is disposed while preventing the nitric acid aqueous solution from entering into the second container, and the electrical conductor having a under p-doped graphene layer obtained from item [2] is disposed in the second container.

The first container is sealed in such a manner that the graphene surface (i.e., the graphene surface exposed by removing the release film) of the under p-doped substrate-graphene structure is p-doped by a nitric acid vapor generated by evaporation in the first container. After 5 minutes, the substrate-graphene structure is taken out from the first container to provide a substrate-graphene structure having a dual p-doped graphene layer on the substrate.

Experimental Example 1: SEM Analysis, XPS Analysis, UPS Analysis, and Raman Spectrum Analysis

Figure 6:
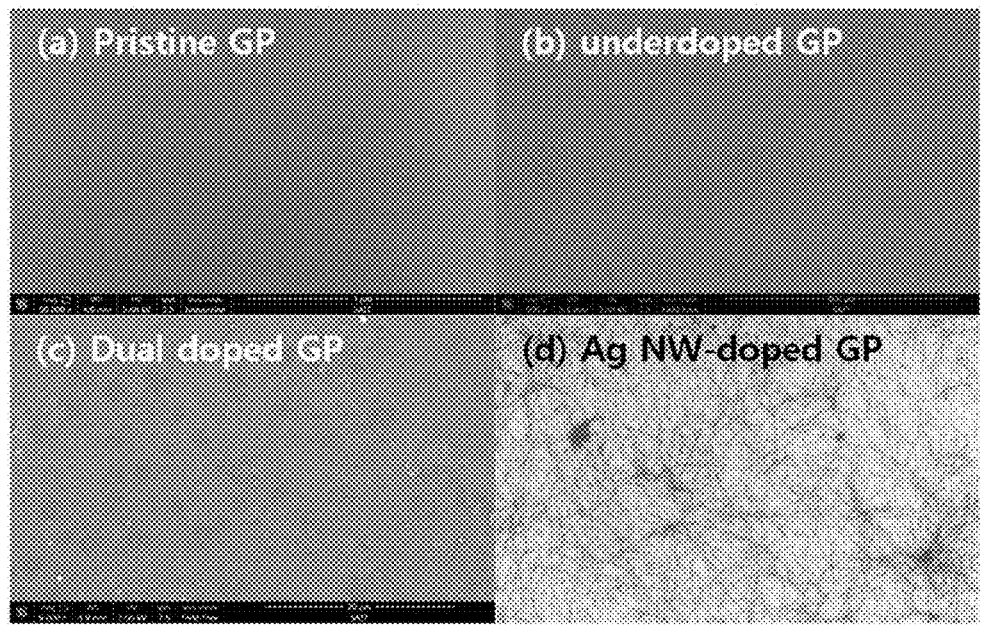
FIG. 6 show surfaces (nanowire) of undoped graphene (pristine GP) (a), under-doped graphene (under-doped GP) (b), dual doped graphene (dual doped GP) in Example 1 (c), and dual doped graphene-silver nanowire hybrid electrical conductor (Ag NW-doped GP) in Example 2 (d), respectively.

[1] A scanning electron microscopic analysis is made for each of the graphene prior to the doping (pristine graphene) and a structure having an under-doped graphene layer and a structure having a dual doped graphene layer obtained from Example 1, and the results are shown in FIGS. 6 (a), (b), (c).

Figure 7:
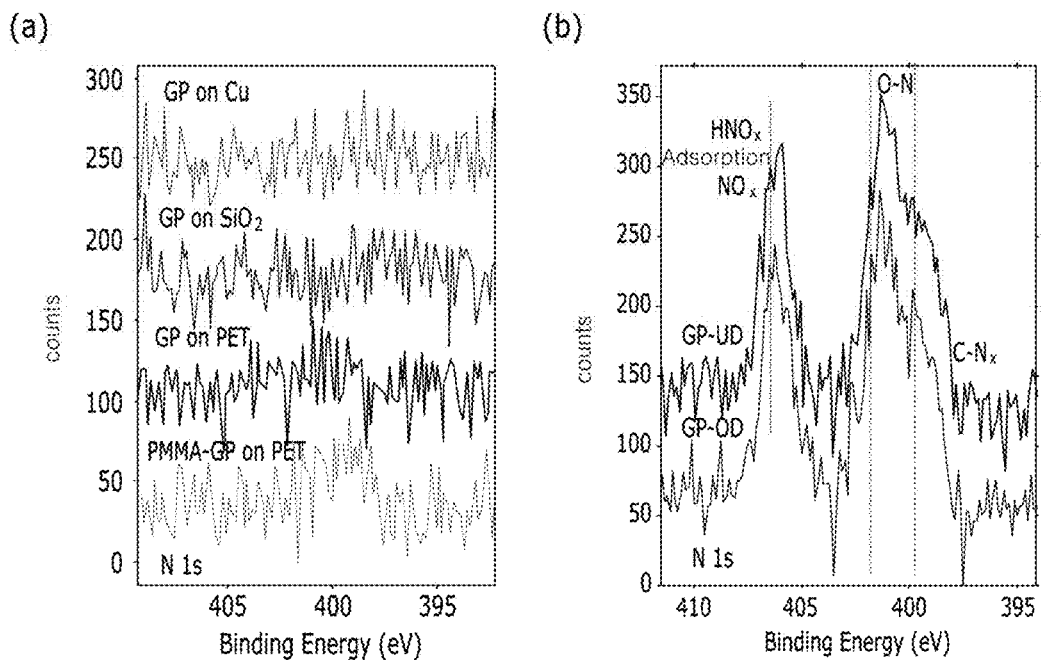
FIG. 7 are graphs of counts versus binding energy (electron volts, eV) showing X-ray photoelectron spectroscopic results of undoped graphene (a) and under-doped graphene (GP-UD) and dual doped graphene (GP-OD) (b) deposited, transferred, treated on the various substrates (Cu, $SiO_2$, PET, PMMA-GP on PET) in Example 1, respectively.

[2] A XPS analysis is made for each of the pristine graphene (i.e., the graphene prior to the doping) and a structure having an under-doped graphene layer and a structure having a dual doped graphene layer obtained from Example 1, and the results are shown in FIGS. 7 (a) and (b), respectively. From FIGS. 7 (a) and (b), it is confirmed that both the over-doping and under-doping processes are performed by p-type doping with nitric acid.

[3] A UPS analysis is made for each of the pristine graphene (i.e., the graphene prior to the doping) and a structure having an under-doped graphene layer and a structure having a dual doped graphene layer obtained from Example 1. From the results, it is confirmed that the work function of undoped graphene is 4.53 electron volts (eV); the work function of under p-doped graphene is 4.88 eV; and the work function of over p-doped graphene is 4.8 eV.

Figure 8:
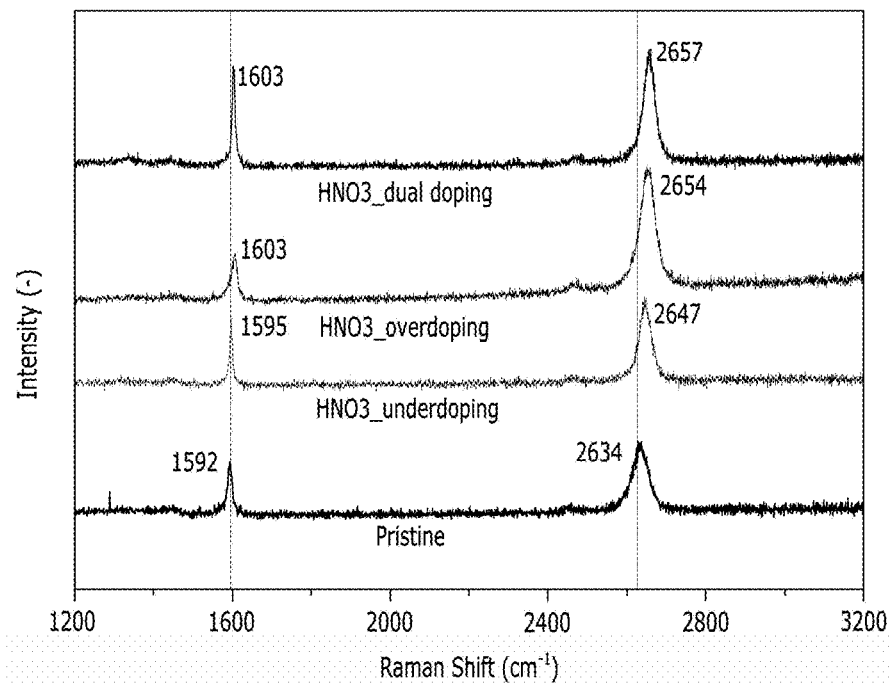
FIG. 8 is a graph of intensity (arbitrary units, a. u.) versus Raman shift (reverse centimeters, $cm^{-1}$) showing Raman spectroscopic results of undoped graphene (pristine), under-doped graphene (under-doping), over-doped graphene (over-doping) and dual doped graphene (dual doping) in Example 1.

[4] A Raman spectrometry analysis is made for each of the pristine graphene (i.e., the graphene prior to the doping) and a structure having an under-doped graphene layer and a structure having a dual doped graphene layer obtained from Example 1, and the results are shown in FIG. 8. As shown in FIG. 8, it is confirmed that G peaks and 2D peaks are shifted to a long wavelength side (blue shift). From the results, it is confirmed that graphene is doped as a p-type.

Comparative Example 1

[1] A graphene-release film structure is obtained in the same manner as Example 1.

[2] Under-doping

A hydrazine aqueous solution having a concentration of 1 M is prepared, and the graphene-release film structure is floated on a surface of the aqueous solution at the room temperature for 10 minutes and then taken out. Subsequently, the graphene-release film structure is disposed on the substrate with the graphene surface being contacted to the glass substrate and dried. Then, the release film is removed therefrom to provide a substrate-graphene stacked structure, and the exposed graphene surface is cleaned by acetone to remove a remaining hydrazine and to provide a substrate-graphene structure (hereinafter, electrical conductor having under n-doped graphene layer) that the lower graphene surface (facing the substrate) is n-doped by hydrazine.

[3] Over-doping

A hydrazine aqueous solution having a concentration of 98% is placed in a sealable first container having a volume of 50 mL. A second container having a volume smaller than the first container is disposed while preventing the hydrazine aqueous solution from entering into the second container, and the electrical conductor having an under-doped graphene layer obtained from item [2] is disposed in the second container.

Figure 9:
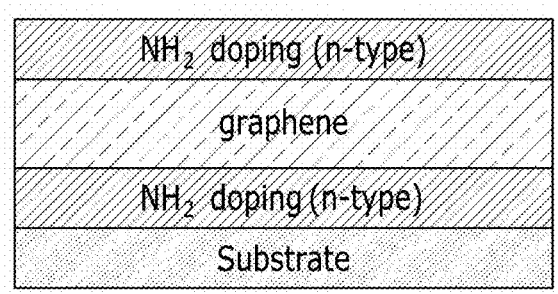
FIG. 9 is a schematic view showing a cross-section of dual n-type doped electrical conductor obtained from Comparative Example 1.

The first container is sealed in such a manner that the graphene surface of the under n-doped substrate-graphene structure is n-doped by hydrazine vapor generated by evaporation in the first container. After 10 minutes, the substrate-graphene structure is taken out to provide a substrate-graphene electrical conductor having a dual n-doped graphene layer. The structure of the obtained conductor is schematically illustrated in FIG. 9.

Comparative Example 2

[1] A graphene-release film structure is obtained in the same manner as Example 1.

[2] Under-doping

A substrate-graphene structure having a graphene lower surface as p-doped with a diluted nitric acid aqueous solution (hereinafter, electrical conductor having a under p-doped graphene layer) is obtained in the same manner as Example 1.

[3] Over-doping

Figure 10:
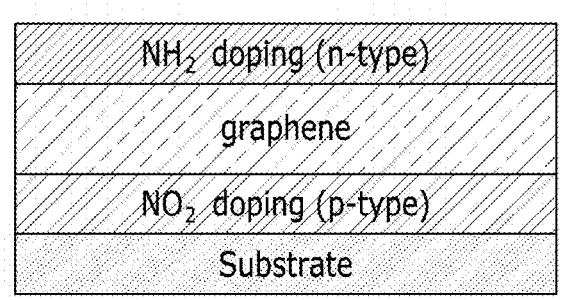
FIG. 10 is a schematic view showing a cross-section of dual (under p-type and over n-type) doped electrical conductor obtained from Comparative Example 2.

Using the electrical conductor having the under p-doped graphene layer obtained from item [2], the over-doping is performed in the same manner as in Comparative Example 1 to provide an electrical conductor having a under p-doped and over n-doped graphene layer. The structure of the obtained conductor is schematically illustrated in FIG. 10.

Comparative Example 3

[1] A graphene-release film structure is obtained in the same manner as Example 1.

[2] Under doping

A substrate-graphene structure having the graphene lower surface n-doped with hydrazine (hereinafter, electrical conductor having an under n-doped graphene layer) is obtained in the same manner as in Comparative Example 1.

[3] Over-doping

Figure 11:
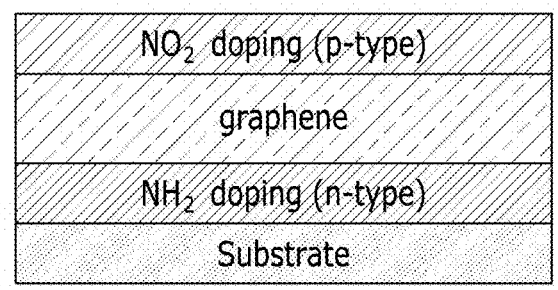
FIG. 11 is a schematic view showing a cross-section of dual (under n-type and over p-type) doped electrical conductor obtained from Comparative Example 3.

Using the electrical conductor having the under n-doped graphene layer obtained from item [2], the over-doping is performed in the same manner as Example 1 to provide an electrical conductor having an under n-doped and over p-doped graphene layer. The structure of the obtained conductor is schematically illustrated in FIG. 11.

Experimental Example 2: Evaluation of Sheet Resistance

For each of the electrical conductors obtained from Example 1 and Comparative Examples 1 to 3, a sheet resistance is measured, and the results are shown in Table 2:

TABLE 2

| | Doping state of first conductive layer including graphene | Sheet resistance | Sheet resistance ratio (%) |
|---|---|---|---|
| Example 1 | Before doping | 905.5 | 100.0 |
| | p-type under-doping | 394.3 | 43.5 |
| | p-type under-doping and p-type over-doping | 299.7 | 33.1 |
| Comparative Example 1 | Before doping | 1000 | 100.0 |
| | n-type under-doping | 5594.5 | 559.5 |
| | n-type under-doping and n-type over-doping | 3075 | 307.5 |
| Comparative Example 2 | Before doping | 860 | 100.0 |
| | p-type under-doping | 354.5 | 41.2 |
| | p-type under-doping and n-type over-doping | 1164 | 135.3 |
| Comparative Example 3 | Before doping | 780 | 100.0 |
| | n-type under-doping | 6723 | 861.9 |
| | n-type under-doping and p-type over-doping | 536 | 68.7 |

In Table 2, the sheet resistance ratio is based on the sheet resistance of the undoped graphene layer. From the results, it is confirmed that the dual p-type doped first conductive layer according to Example 1 shows a significantly improved electric conductivity compared to that of the dual n-doped first conductive layer according to Comparative Example 1. In addition, it is confirmed that the dual p-type doped first conductive layer according to Example 1 shows an electric conductivity higher in greater than or equal to about 2 times or greater than or equal to about 4 times of the first conductive layer in which the over-doping and the under doping are different as in Comparative Example 2 and Comparative Example 3.

Experimental Example 3: Evaluation of Light Transmittance

For each of the electrical conductors obtained from Example 1 and Comparative Examples 1 to 3, a light transmittance is measured, and the results are shown in Table 3:

TABLE 3

| | Doping state of first conductive layer including graphene | Light transmittance (%) | Light transmittance ratio (%) |
|---|---|---|---|
| Example 1 | Before doping | 90.67 | 100 |
| | p-type under-doping | 90.66 | 99.98897 |
| | p-type under-doping and p-type over-doping | 90.67 | 100 |
| Comparative Example 1 | Before doping | 90.67 | 100 |
| | n-type under-doping | 90.65 | 99.97794 |
| | n-type under-doping and n-type over-doping | 90.69 | 100.02206 |

TABLE 3-continued

|  | Doping state of first conductive layer including graphene | Light transmittance (%) | Light transmittance ratio (%) |
|---|---|---|---|
| Comparative Example 2 | Before doping | 90.67 | 100 |
|  | p-type under-doping | 90.66 | 99.98897 |
|  | p-type under-doping and n-type over-doping | 90.4 | 99.70221 |
| Comparative Example 3 | Before doping | 90.67 | 100 |
|  | n-type under-doping | 90.55 | 99.86765 |
|  | n-type under-doping and p-type over-doping | 90.7 | 100.03308 |

In Table 3, the light transmittance ratio is determined with respect to the light transmittance of the undoped graphene layer. From the results, it is confirmed that the dual p-type doped first conductive layer according to Example 1 may maintain a high light transmittance in a similar level (e.g., greater than or equal to about 90%) to the level before the doping.

Example 2

[1] A silver nanowire composition having the following components is obtained:
4.8 grams (g) of nanowire aqueous solution (concentration: 0.5 percent by weight (wt %), silver nanowire having an average diameter of 30 nanometers, nm),
solvent: 8.1 g of water and 4.7 g of ethanol, and
binder: 1.1 g of hydroxypropyl methyl cellulose aqueous solution (concentration: 0.25%).
[2] The silver nanowire composition is bar-coated on the surface of p-type doped graphene of the electrical conductor obtained from Example 1 and dried at 85° C. for one minute under the air to provide a final electrical conductor.

Comparative Example 4

A final electrical conductor is obtained in the same manner as in Example 2, except that the silver nanowire composition is bar-coated on the surface of n-type doped graphene of electrical conductor obtained from Comparative Example 1.

Comparative Example 5

A final electrical conductor is obtained in the same manner as in Example 2, except that the silver nanowire composition is bar-coated on the surface of n-type doped graphene of electrical conductor obtained from Comparative Example 2.

Comparative Example 6

A final electrical conductor is obtained in the same manner as in Example 2, except that the silver nanowire composition is bar-coated on the surface of p-type doped graphene of electrical conductor obtained from Comparative Example 3.

Reference Example 1

[1] A graphene-release film structure is obtained in the same manner as Example 1. The structure is disposed on the substrate with the graphene surface being faced to a substrate. The release film is removed to provide a structure having the undoped graphene surface as exposed.

The silver nanowire composition of Example 2 is bar-coated on the undoped graphene surface and dried at 85° C. for 1 minute under the air to provide a final electrical conductor.

Experimental Example 4: Evaluation of Sheet Resistance

For each of the electrical conductors obtained from Example 2, Comparative Examples 4 to 6, and Reference Example 1, a sheet resistance is measured, and the results are shown in Table 4:

TABLE 4

|  | Sheet resistance | Sheet resistance ratio |
|---|---|---|
| Example 2 | 299 | 35.4% |
| Comparative Example 4 | 584 | 69.1% |
| Comparative Example 5 | 959 | 113.5% |
| Comparative Example 6 | 1078 | 127.8% |
| Reference Example 1 | 845.3 | 100% |

In Table 4, the sheet resistance ratio is determined with respect to the sheet resistance of electrical conductor (Ag NW-undoped graphene hybrid) according to Reference Example 1. As shown in Table 4, it is confirmed that the electrical conductor of Example 2 shows an electric conductivity increased by at least 2 times or at least 3 times of the electrical conductors of Comparative Examples.

Experimental Example 5: Evaluation of Light Transmittance

For each of the electrical conductors obtained from Example 2, Comparative Examples 4 to 6 and Reference Example 1, a light transmittance is measured, and the results are shown in Table 5:

TABLE 5

|  | Light transmittance (%) | Light transmittance ratio (%) |
|---|---|---|
| Example 2 | 90.065 | 99.7840 |
| Comparative Example 4 | 89.87 | 99.5679 |
| Comparative Example 5 | 89.32667 | 98.9659 |
| Comparative Example 6 | 90.19 | 99.9224 |
| Reference Example 1 | 90.26 | 100 |

In Table 5, the light transmittance ratio is determined with respect to the light transmittance of electrical conductor (Ag NW-undoped graphene hybrid) according to Reference Example 1. From the results, it is confirmed that the electrical conductor of Example 2 may maintain a light transmittance at a similar level (e.g., greater than or equal to about 90%) to the electrical conductor of Reference Example.

Example 3

Figure 12:
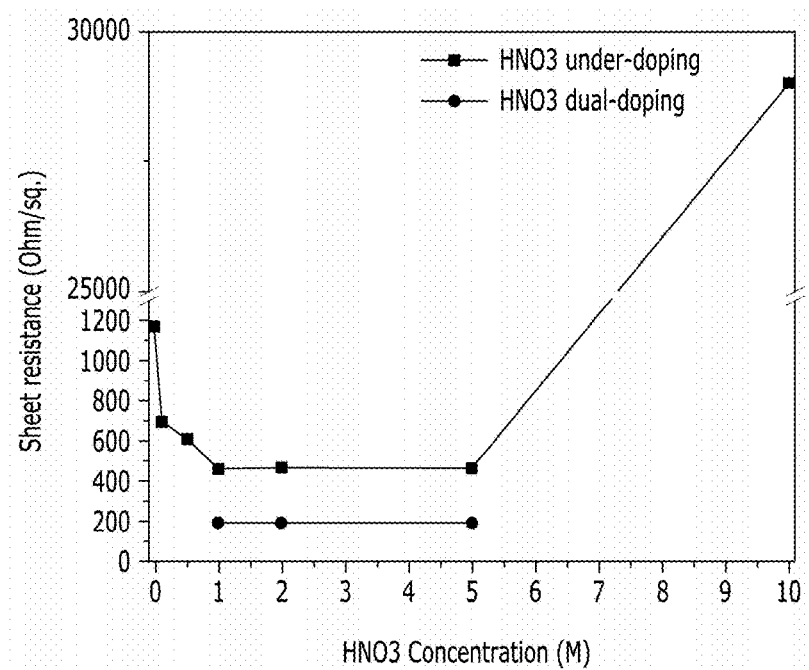
FIG. 12 is a graph of sheet resistance, (ohms per square, Ohm/sq.) versus nitric acid ($HNO_3$) concentration (molar, M) showing a sheet resistance change of doped electrical conductor according to the nitric acid concentration change of nitric acid aqueous solution for the doping in Example 3.
Figure 13:
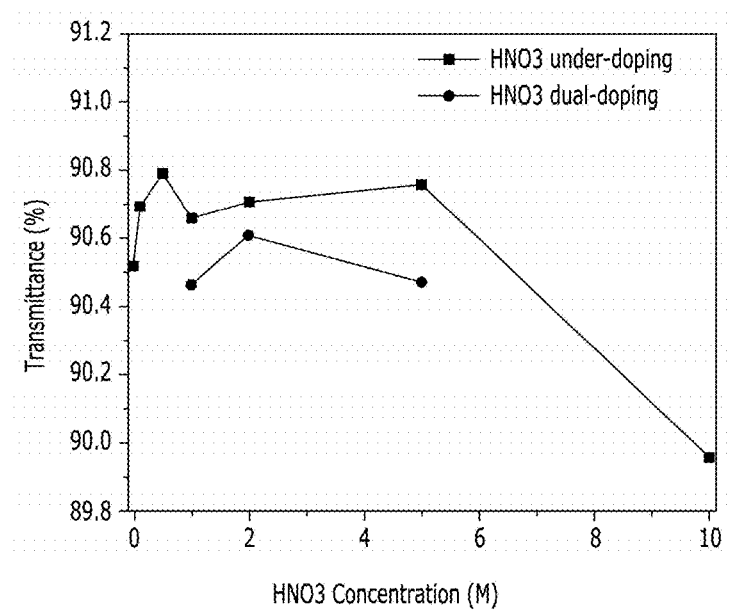
FIG. 13 is a graph of transmittance (percent, %) versus nitric acid ($HNO_3$) concentration (molar, M) showing a light transmittance change of doped electrical conductor according to the nitric acid concentration change of nitric acid aqueous solution for the doping in Example 3.

While changing a concentration of nitric acid aqueous solution for the under-doping, the obtained electrical conductor is measured for a sheet resistance change and a light transmittance, and the results are shown in FIG. 12 and FIG. 13.

From the results of FIGS. 12 and 13, it is confirmed that 1 M of nitric acid aqueous solution for the under-doping shows an effective doping efficiency.

Example 4

For the over-doping, an electrical conductor is fabricated in the same manner as Example 1, except that 10 millimolar (mM) of gold trichloride ($AuCl_3$) aqueous solution is used instead of the nitric acid aqueous solution.

It is confirmed that the obtained electrical conductor shows a sheet resistance of 220 ohms per square (ohm/sq.) and a transmittance of 90.42%.

While this disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims.

What is claimed is:

1. An electrical conductor comprising:
   a substrate;
   a first conductive layer comprising graphene; and
   a second conductive layer comprising a conductive metal nanowire,
   wherein the first conductive layer and the second conductive layer are disposed on the substrate, wherein the first conductive layer is disposed between the substrate and the second conductive layer or on the second conductive layer,
   wherein the first conductive layer has a first surface facing the second conductive layer and a second surface which is opposite to the first surface, and
   wherein, in the first surface and the second surface, the graphene is p-doped with a p-type dopant.

2. The electrical conductor of claim 1, wherein the substrate comprises glass, a semielectrical conductor, a polymer, or a combination thereof.

3. The electrical conductor of claim 2, wherein the polymer is polyester, polycarbonate, polyimide, or a combination thereof.

4. The electrical conductor of claim 1, wherein the graphene is monolayered graphene or multi-layered graphene having 10 or less monolayers.

5. The electrical conductor of claim 1, wherein the first conductive layer comprises transferred graphene.

6. The electrical conductor of claim 1, wherein the first conductive layer comprises a plurality of graphene nanosheets.

7. The electrical conductor of claim 1, wherein the conductive metal nanowire comprises silver, copper, gold, aluminum, cobalt, palladium, or a combination thereof.

8. The electrical conductor of claim 1, wherein the conductive metal nanowire has an average diameter of less than or equal to about 50 nanometers and an average length of greater than or equal to about 1 micrometer.

9. The electrical conductor of claim 1, wherein the p-type dopant has a work function of greater than or equal to about 4.52 electron volts.

10. The electrical conductor of claim 9, wherein the p-type dopant comprises a metal, a metal oxide, a metal salt, an inorganic acid, an organic compound, or a combination thereof.

11. The electrical conductor of claim 10, wherein the p-type dopant comprises gold, silver, palladium, titanium, gallium, aluminum, tungsten, ruthenium, copper, or a combination thereof.

12. The electrical conductor of claim 11, wherein the p-type dopant comprises a metal nanoparticle, a metal oxide, a metal oxide nano particle, a metal salt, a metal halide, a metal trifluoromethanesulfonate, a metal trifluoromethanesulfonylimide, or a combination thereof.

13. The electrical conductor of claim 12, wherein the p-type dopant comprises a gold nanoparticle, a silver nanoparticle, a palladium nanoparticle, a titanium nanoparticle, a gallium nanoparticle, AgCl, $AuCl_3$, $FeCl_3$, $GaCl_3$, $HAuCl_4$, silver trifluoromethanesulfonate (AgOTf), $AgNO_3$, aluminum trifluoromethanesulfonate, silver bistrifluoromethanesulfonylimide, or a combination thereof.

14. The electrical conductor of claim 1, wherein the p-type dopant comprises nitric acid, sulfuric acid, hydrochloric acid, phosphoric acid, $NO_2BF_4$, $NOBF_4$, $NO_2SbF_6$, $H_3CCOOH$, dichlorodicyanoquinone, oxone, dimyristoyl phosphatidylinositol, benzimidazole, bistrifluoromethanesulfonylamide, bistrifluoromethanesulfonylimide, N,N-di(1-naphthyl)-N,N-diphenylbenzidine, chloroform, $NO_2$, a C6 to C40 aromatic compound, 2,3,5,6-tetrafluoro-7,7,8,8-tetracyanoquinodimethane, 7,7,8,8-tetracyanoquinodimethane, tetracyanoethylene, tetrakis(dimethylamino)ethylene, anthracene, melamine, water, ozone, 9,10-dibromoanthracene, tetrasodium 1,3,6,8-pyrenetetrasulfonic acid, a perfluoro polymer, polymethylmethacrylate, polyvinylidene difluoride, ammonia, triazine, 1,5-naphthalenediamine, 9,10-dimethylanthracene, nitromethane, or a combination thereof.

15. The electrical conductor of claim 1, wherein the p-type dopant is nitric acid, gold trichloride, benzimidazole, or a combination thereof.

16. The electrical conductor of claim 1, wherein in the first surface and the second surface, the graphene is doped with the same p-type dopant.

17. The electrical conductor of claim 16, wherein in the first surface, the graphene is doped with an inorganic acid, and in the second surface, the graphene is doped with a metal halide.

18. The electrical conductor of claim 16, wherein in the second surface, the graphene is doped with an inorganic acid and in the first surface, the graphene is doped with a metal halide.

19. The electrical conductor of claim 1, wherein in the first surface and the second surface, the graphene is doped with an inorganic acid.

20. The electrical conductor of claim 1, wherein in the first surface and the second surface, the graphene is doped with p-type dopants which are different from each other.

21. The electrical conductor of claim 1, wherein the electrical conductor is a transparent electrode, an electrode for a touch screen panel, or a flexible electrode for a flexible display.

22. An electronic device comprising the electrical conductor of claim 1.

23. A method of producing the electrical conductor of claim 1, comprising:
obtaining a first conductive layer having a release film and graphene disposed directly on the release film;
p-type doping a surface of the graphene of the first conductive layer with a first p-type dopant;
disposing the first conductive layer on the substrate with the p-type doped surface of the graphene facing the substrate;
removing the release film from the first conductive layer to expose a undoped surface of the graphene;
p-type doping the undoped surface of the graphene with a second p-type dopant; and
forming a second conductive layer comprising a conductive metal nanowire on the surface of the p-type doped graphene.

24. The method of claim 23,
wherein the p-type doping with the first p-type dopant comprises bringing a solution comprising the first p-type dopant into a contact with the graphene layer of the first conductive layer, and
wherein the p-type doping with the second p-type dopant comprises bringing a vaporized second p-type dopant into a contact with the surface of the undoped graphene.

25. The method of claim 23, wherein the first p-type dopant and the second p-type dopant are a metal nanoparticle, a metal halide, a metal salt, an inorganic acid, an organic compound, a metal trifluoromethanesulfonate, a metal trifluoromethanesulfonylimide, or a combination thereof.

26. The method of claim 23, wherein the first p-type dopant and the second p-type dopant are the same materials.

27. The method of claim 23, wherein the first p-type dopant and the second p-type dopant are materials which are different from each other.

28. An electronic device comprising the electrical conductor of claim 21.

29. The electronic device of claim 22, wherein the electronic device is a flat panel display, a touch screen panel, a solar cell, an e-window, an electrochromic mirror, a heat mirror, a transparent transistor, or a flexible display.

* * * * *